(12) United States Patent
Hyoudo et al.

(10) Patent No.: US 6,461,893 B2
(45) Date of Patent: Oct. 8, 2002

(54) METHOD FOR MANUFACTURING AN ELECTRONIC DEVICE

(75) Inventors: Haruo Hyoudo, Osaka (JP); Shigeo Kimura, Osaka (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 09/874,969

(22) Filed: Jun. 7, 2001

(65) Prior Publication Data
US 2001/0042898 A1 Nov. 22, 2001

Related U.S. Application Data

(62) Division of application No. 09/557,962, filed on Apr. 25, 2000, now Pat. No. 6,285,067.

(30) Foreign Application Priority Data

Apr. 26, 1999 (JP) .......................................... 11-118514
Jul. 23, 1999 (JP) .......................................... 11-209423

(51) Int. Cl.⁷ ............................................... H01L 21/48
(52) U.S. Cl. ..................... 438/106; 438/460; 438/462; 257/792
(58) Field of Search ........................... 438/23, 68, 613, 438/458, 460–465; 257/792, 790, 783–787

(56) References Cited

U.S. PATENT DOCUMENTS

| | | | |
|---|---|---|---|
| 3,699,403 A | 10/1972 | Bolcky, III | |
| 5,661,330 A | 8/1997 | Aimi et al. | |
| 5,682,057 A | 10/1997 | Kuriyama | |
| 5,882,998 A | 3/1999 | Sur, Jr. et al. | |
| 5,987,744 A | 11/1999 | Lan et al. | |
| 6,078,092 A | 1/2000 | Wang | |
| 6,255,741 B1 * | 7/2001 | Yoshihara et al. | .......... 257/792 |

FOREIGN PATENT DOCUMENTS

| | | |
|---|---|---|
| JP | 62-172625 | 7/1987 |
| JP | 6-244494 | 9/1994 |

* cited by examiner

Primary Examiner—David Nelms
Assistant Examiner—Dung Anh Le
(74) Attorney, Agent, or Firm—Wenderoth, Lind & Ponack, L.L.P.

(57) ABSTRACT

In producing an electronic device such as an overcurrent-protection element, a large substrate 21 is prepared with a plurality of element mounting sections 50. Electrodes 25 and 26 are formed on the surface of the substrate 21 in each of the element mounting sections 50. A fine metal wire 27 is connected between the electrodes 25 and 26 to form a fuse element. A framework portion 41 surrounds each element mounting section 50, forming a depression 24. The depression 24 houses the fine metal wire 27. A cover member 31 is placed over the top of the framework 41, hermetically sealing the depressions 24. Subsequently, the cover member 31 and substrate 21 are cut together, separating each of the element mounting sections 50 to obtain individual electronic devices.

16 Claims, 9 Drawing Sheets

METHOD FOR MANUFACTURING AN ELECTRONIC DEVICE

This application is a divisional application of application Ser. No. 09/557,962, filed Apr. 25, 2000, now U.S. Pat No. 6,285,067.

BACKGROUND OF THE INVENTION

1. Field of the Invention

The present invention relates to a method for manufacturing an electronic device having a hollow package and suitable for use in overcurrent-protection devices, and particularly to an electronic device, which houses an overcurrent-protection device.

2. Description of the Prior Art

Overcurrent-protection devices are often installed in electronic equipment to prevent electronic components therein from being damaged due to overcurrents or miss-connection of power sources in reverse. Generally, these overcurrent-protection devices are formed of a fuse element designed to melt just before the current becomes large enough to damage the electronic components. Conventional fuse elements of old days were sealed in a glass tube. Newly conventional fuse elements were sealed in resin, that is, for example, disclosed in Japanese laid-open utility model publication 57-46615.

FIG. 1 shows a conventional resin-sealed overcurrent-protection device. The device includes a pair of leads 1 and 2; a fine wire 3 made of gold, silver, or the like and connected to the leads 1 and 2 by wire bonding; and a nonflammable resin 4 surrounding the leads 1 and 2 and housing the fine wire 3 therein. The resin 4 comprises, for example, a silicon resin or the like and is formed by molding. The fine wire of metal 3 has a diameter of approximately 30 um and serves as a fuse element, in which the diameter of the wire is determined by a relationship between the diameter and it's cutoff or fusing current.

However, although the resin 4 is classified to be nonflammable, it can emit sparks and smoke or change color due to heat generated when the fine wire 3 is melted off by overcurrents. When the element designed to protect equipment thereby emits sparks or smokes, it may affect the equipment in an adverse manner, and reduce reliability thereof.

Widely varied types of portable electronic equipment such as mobile telephones are powered by batteries in portable use, and it is necessary to implement measures for protection from miss-connection of the batteries in reverse during installation thereof. In such equipment, an overcurrent—protection element is essential. However, by employing these conventional elements in portable electronic equipment, it tends to make the equipment larger, while the equipment is required to be lighter, thinner, and smaller all around.

SUMMARY OF THE INVENTION

In view of the foregoing, it is an object of the present invention to provide an electronic device and a method for manufacturing an electronic device such as a small overcurrent-protection device that does not emit sparks or smoke or cause the device to change color or shape when the fuse element melts.

To achieve the object of the present invention, there is provided a method for manufacturing an electronic device, comprising: preparing a common substrate having a plurality of element mounting sections; fixing an element in each of the element mounting sections; sealing the element mounting sections in a hollow space by using a common cover member; and separating the plurality of element mounting sections into individual electronic devices.

According to a second aspect of the present invention, there is provided an electronic device, comprising: a substrate having first and second main surfaces; at least a pair of electrodes formed on the first main surface of the substrate; a fuse element connecting each of the pair of electrodes; a cover member hermetically sealing the fuse elements in a hollow space; and external connection terminals formed on the second main surface of the substrate and electrically connected to each one of the electrodes.

The above and other objects, features, and advantages of the present invention will become apparent from the following description when taken in conjunction with the accompanying drawings which illustrate preferred embodiments of the present invention by way of example.

DETAILED DESCRIPTION OF THE PREFERRED EMBODIMENTS

An electronic device according to preferred embodiments of the present invention will be described while referring to the accompanying drawings.

First Embodiment

A first embodiment will be described with reference to FIGS. 2A, 2B and 3A,3B.

Figure 1:
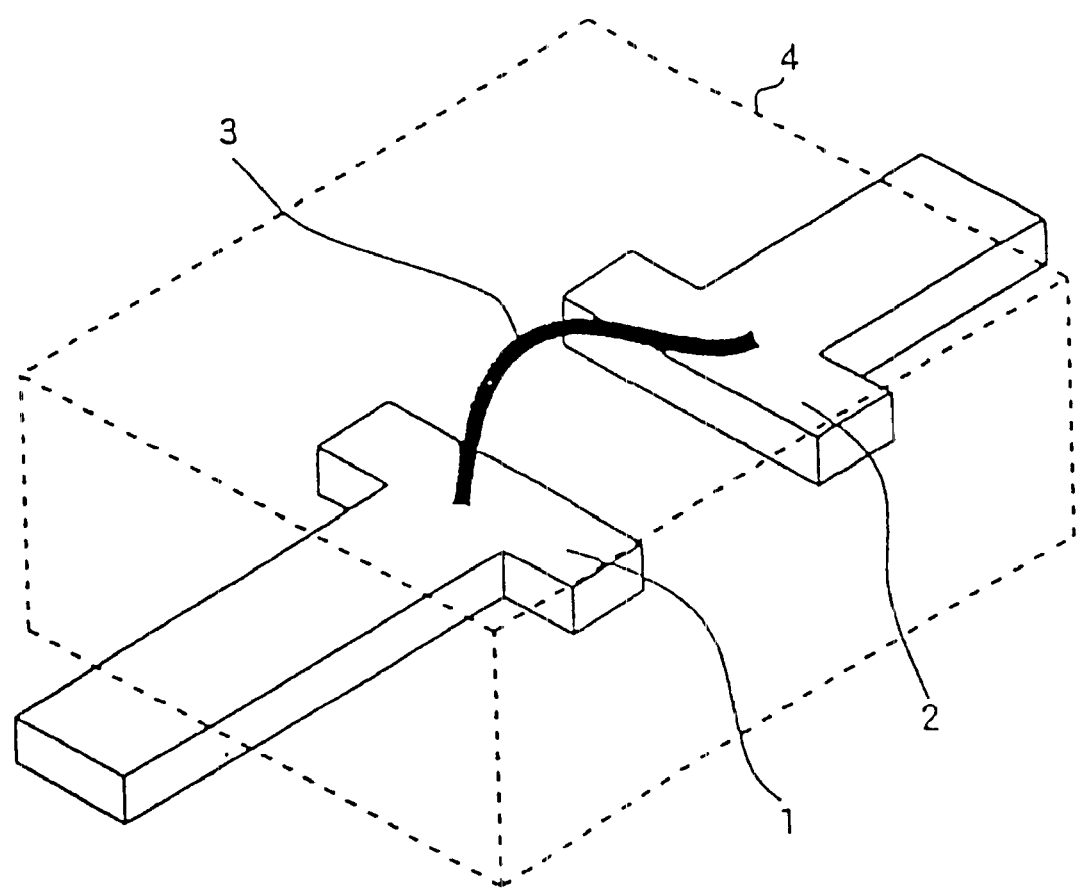
FIG. 1 is a perspective view showing a conventional resin-sealed overcurrent-protection device.
Figure 2A:
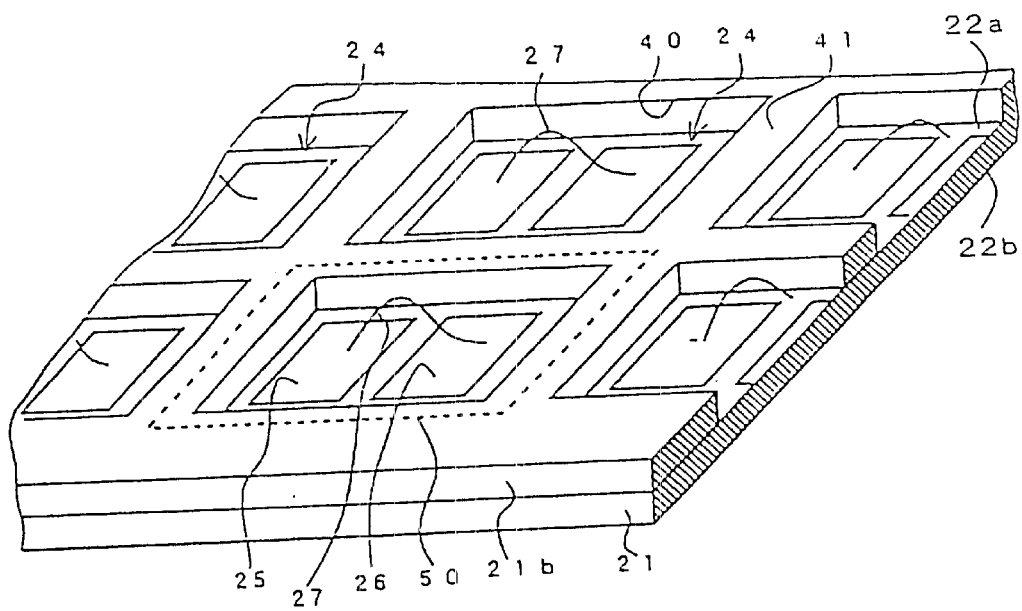
FIGS. 2A and 2B are perspective views showing steps of manufacturing an electronic device respectively according to a first embodiment of the present invention.

Step 1: see FIG. 2A

First, a large substrate 21 is prepared. The substrate 21 has a first main surface 22a, on which a plurality of pairs of electrodes 25 and 26 is formed. A second substrate 21b is fixed on first main surface 22a. The second substrate 21b has a plurality of through-holes 40 for exposing each of the pair of electrodes 25 and 26 in the mesh of net-like structure thereof, which forms depressions 24 therein. Each of element mounting sections 50 comprises one of the depressions 24, which is surrounded by a framework portion 41 of the second substrate 21b. The element mounting sections 50 are arranged at equal intervals both longitudinally and laterally.

After preparing the substrate 21 with this configuration, a fuse element is formed in each depression 24 by connecting each pair of electrodes 25 and 26 with a fine wire 27 by wire bonding. It is also possible to fix the substrate 21b to the substrate 21 after performing the wire bonding process. The substrate 21 and substrate 21b may be integrally formed as one substrate rather than two separate substrates.

Figure 2B:
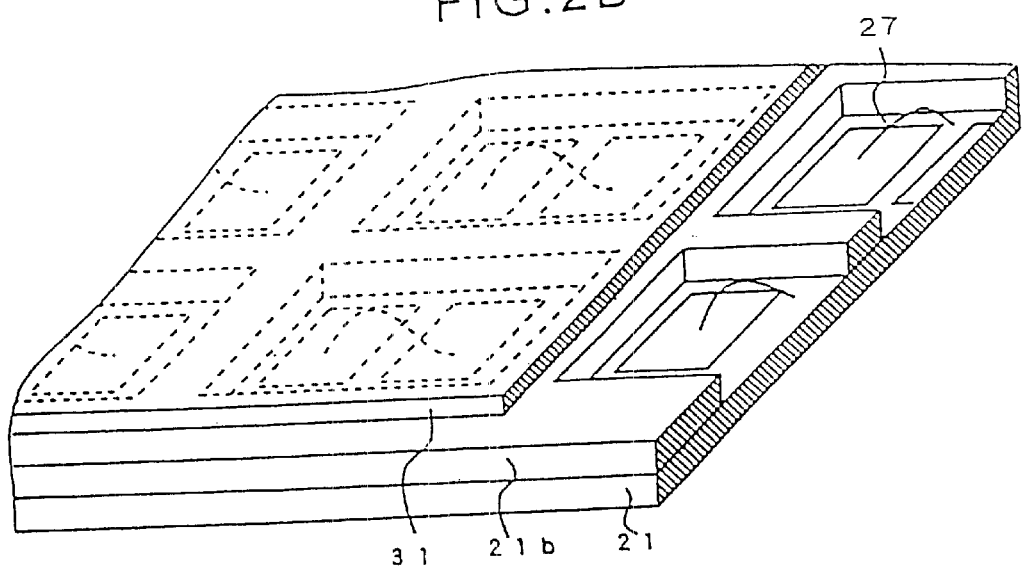

Step 2: see FIG. 2B

A plate-shaped cover member 31 is fixed to the top surface of the substrate 21b to hermetically seal the plurality of depressions 24. By this process, a fuse element is sealed within each one of the airtight depressions 24. A glass type adhesive, or epoxy type adhesive, is used to adhere the cover member 31 on the substrate 21b.

Figure 3A:
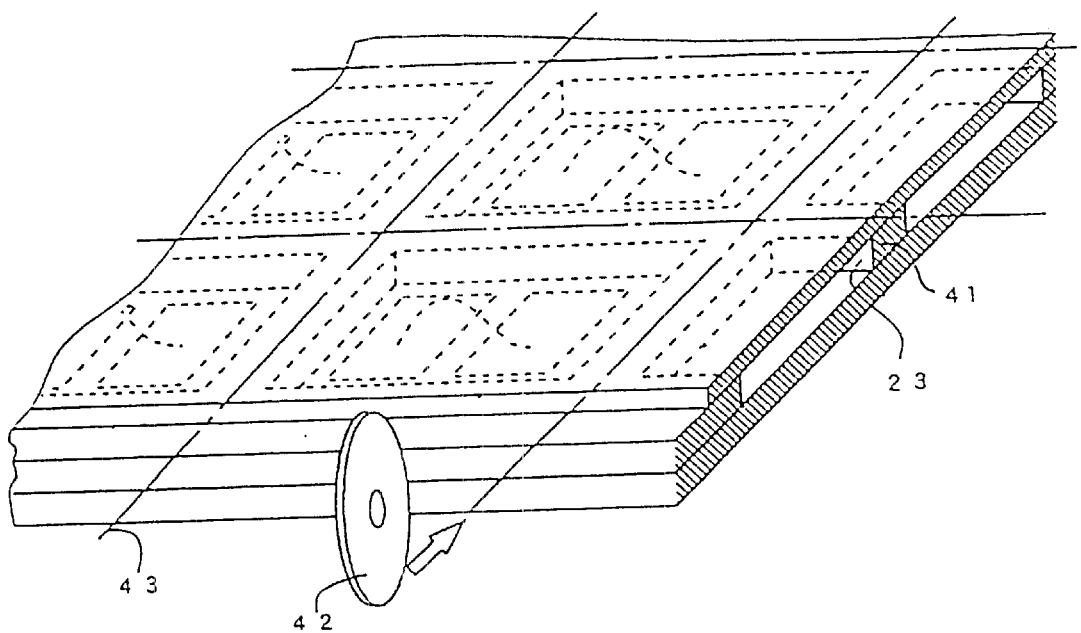
FIGS. 3A and 3B are perspective views showing a step of manufacturing an electronic device according to the first embodiment of the present invention.
Figure 3B:
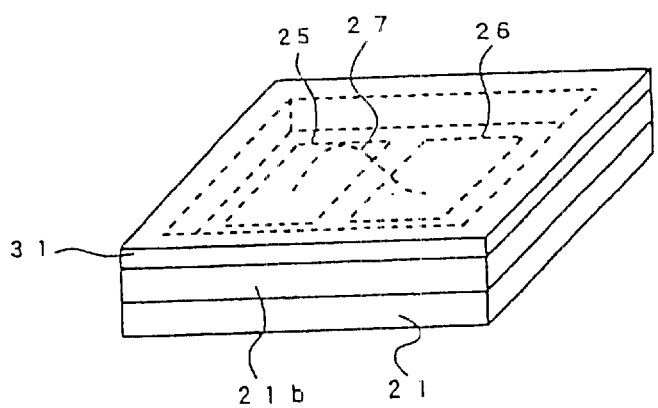

Step 3: see FIGS. 3A and 3B

Next, cutting along the guide marks, as shown in FIG. 2 (B) is carried out to separate each of the element mounting sections 50 to obtain individual devices. A dicing blade 42 is used to separate the element mounting sections 50. The process is conducted by fixing a dicing sheet to the bottom surface of the substrate 21 (second main surface 22b) and cutting through the substrate 21 and substrate 21b along longitudinal and lateral dicing lines 43 using the dicing blade 42. This cutting process forms side portions- 23 of the framework portion 41.

Second Embodiment

Figure 4A:
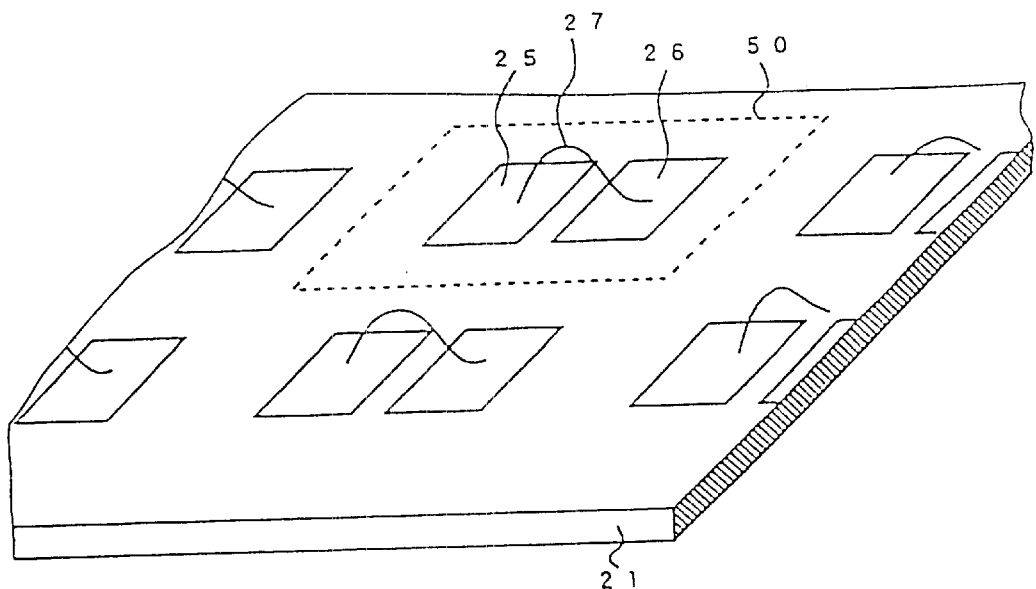
FIGS. 4A and 4B are perspective views showing steps of manufacturing an electronic device respectively according to a second embodiment of the present invention.
Figure 4B:
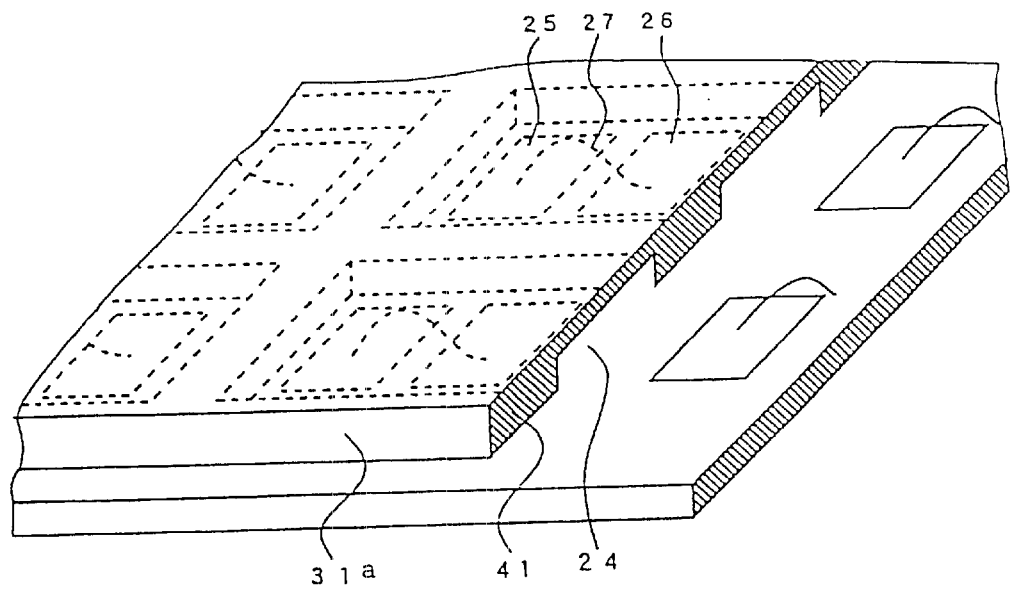

A second embodiment of the present invention will be described with reference to FIGS. 4A–5B. FIGS. 4A and 4B show electronic devices of the second embodiment of the present invention that contain fuse elements.

Step 1: see FIG. 4A

A flat substrate 21 having a plurality of element mounting sections 50 is manufactured. Multiple pairs of electrodes 25 and 26 are arranged on the first main surface 22a of the substrate 21. The area surrounding each pair of electrodes 25 and 26 forms the element mounting section 50. Each element mounting section 50 is arranged at equal intervals both longitudinally and laterally.

After preparing the substrate 21 in this way, a fuse element is formed in each of the element mounting sections 50 by bonding a fine wire between the electrodes 25 and 26.

Step 2: see FIG. 4B

A cover member 31a having a plurality of depressions 24 positioned to correspond to each of the element mounting sections 50 is prepared. The framework portion 41 of the cover member 31a is fixed to the surface of the substrate 21 such that the depressions 24 are hermetically sealed. As a result, each of the fuse elements is sealed in an airtight space.

Step 3: Not Shown in the Drawings

Next, the cover member 31a and substrate 21 are cut by dicing to separate each of the electronic devices therefrom, as shown in the first embodiment.

The process described above enables a plurality of devices to be manufactured simultaneously. This process is simpler and achieves a smaller package size than when packaging each device individually.

Figure 5A:
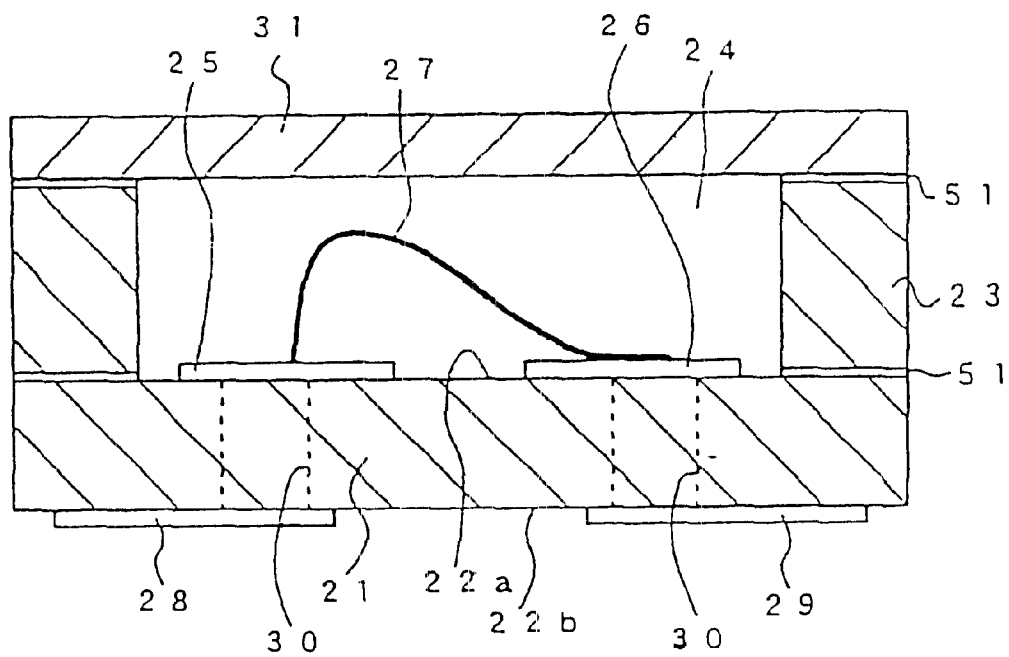
FIGS. 5A and 5B are a cross-sectional view and a plan view showing an overcurrent-protection device manufactured according to the first embodiment of the present invention.
Figure 5B:
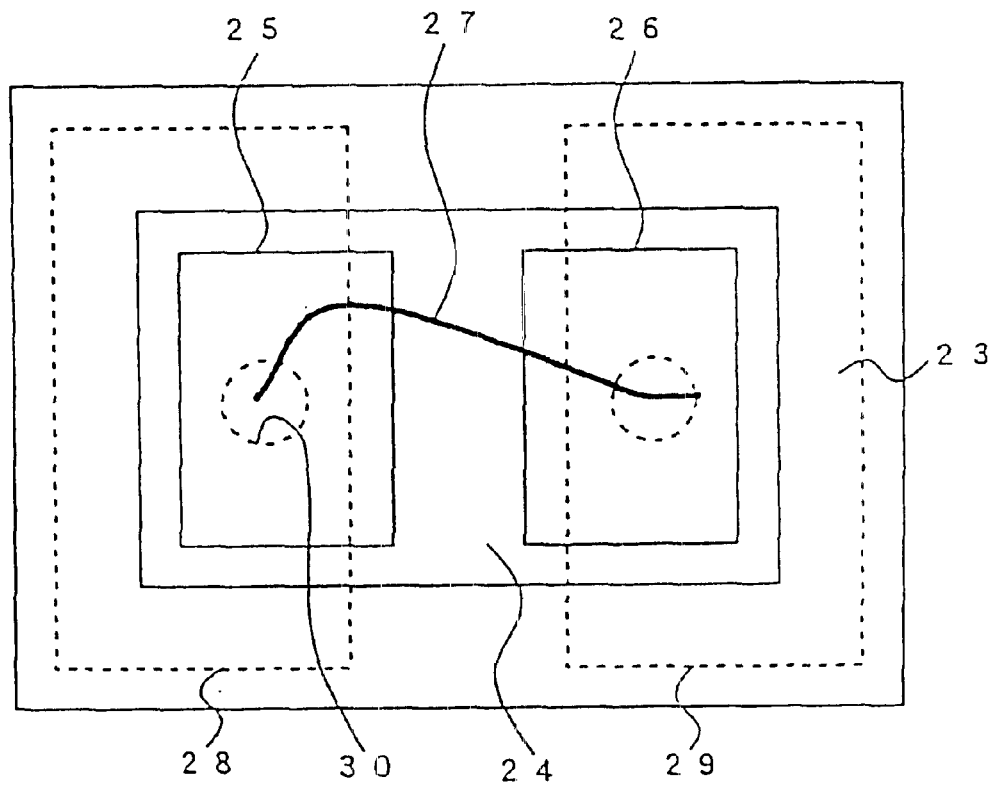

FIGS. 5A and 5B are a cross-sectional view and a plan view showing an overcurrent-protection device manufactured according to the method described in the first embodiment.

The substrate 21 shown in the drawing is formed of an insulating material, such as ceramic or a glass epoxy, and has a thickness of 250 $\mu$m–350 $\mu$m. When looking at the plan view in FIG. 5B, the substrate 21 has a rectangular shape with approximate dimensions of 1.5 mm ×2.5 mm. The substrate 21 has the first main surface 22a at its top surface and the second main surface 22b at its bottom surface. The frame-like side portion 23 has a height of 0.4 mm and a width of 0.5 mm and is disposed around the outer circumference of the substrate 21, forming the depression 24 in the central portion of the substrate 21. The side portions 23 are obtained by cutting the framework portion 41 approximately through the center thereof. In the present embodiment, the substrate 21 and side portion 23 are formed separately and fixed together with an adhesive 51. However, the substrate 21 and side portion 23 can also be integrated as one unit. In the second embodiment, the cover member 31a has side portions 23 integrally formed therewith.

The electrodes 25 and 26 are formed by a conductive pattern of gold plating or the like on the first main surface 22a. The fine wire 27 having a diameter of approximately 30 $\mu$m is connected between the electrodes 25 and 26 by wire bonding. The fine wire 27 is formed of gold having a purity of 99.99%, or the fine wire is formed of soldering or the like. The fine wire 27 is first bonded to the electrode 25 and next bonded to the electrode 26, forming a wire loop whose height remains less than the height of the depressions 24.

External connector terminals 28 and 29 are formed by a conductive pattern of gold plating on the second main surface 22b. Via holes 30 are disposed to penetrate the substrate 21 beneath the electrodes 25 and 26. The via holes 30 are filled with a conducting material such as tungsten, thereby electrically connecting the electrode 25 to the connector terminal 28 and the electrode 26 to the connector terminal 29. The edges of the external connector terminals 28 and 29 are disposed approximately 0.1 mm–0.2 mm from the edges of the substrate 21. It is also desirable for the fine wire 27 to be connected on the electrodes 25 and 26 at positions located directly above the via holes 30.

The cover member 31 formed of a ceramic plate having a thickness of approximately 0.15 mm–0.25 mm is fixed by the adhesive 51 to the top surface of the side portions 23 such that the depressions 24 become airtight. As a result, the fine wire 27 is enclosed within a completely airtight space. The cover member 31 and side portion 23 can also be constructed as one integral unit.

The above described overcurrent-protection device is mounted such that the external connector terminals 28 and 29 are fixed to the opposing electrode patterns on the mounting board, respectively. If a current larger than the rated current flows therethrough between the external connector terminals 28 and 29, the current flowing through the fine wire 27, generates an abrupt temperature rise due to the specific resistance in the fine wire 27. As a result, the fine wire 27 will melt from the generated heat, thereby performing its function to protect against overcurrents. The melting current for the gold wire described above having a diameter of 30 $\mu$m is approximately 4 A (over 1–5 seconds). In most cases, the fine wire 27 melts at a point near its center, rather than near the electrodes 25 and 26, due to the relationship between heat radiation and resistance. Since the point of the wire melting is not in contact with resin or any other material and enclosed in the hermetic sealed space, the device will not emit sparks or smoke or change in color or shape. Further, since the fine wire 27 melts due to an overcurrent, the circuit between the terminals becomes completely open.

As an alternative to the fine bonding wire, the fuse element can be configured by a conductive pattern disposed on the surface of the substrate, which connect the electrodes 25 and 26 having a narrowed portion of wedge shape. Another alternative, is to configure the fuse element with a polysilicon resistor. In either case, the area subject to melting must be housed within the depression 24. Further, the sealed depressions 24 are filled with only air in this embodiment. However, the depressions 24 can also be filled with a noncombustible gas, such as nitrogen and the like.

Third Embodiment

A third embodiment of the present invention will be described with reference to FIGS. 6A,6B and 7A,7B. In the electronic device of the third embodiment, the depression 24 houses a semiconductor chip instead of a fuse element.

Figure 6A:
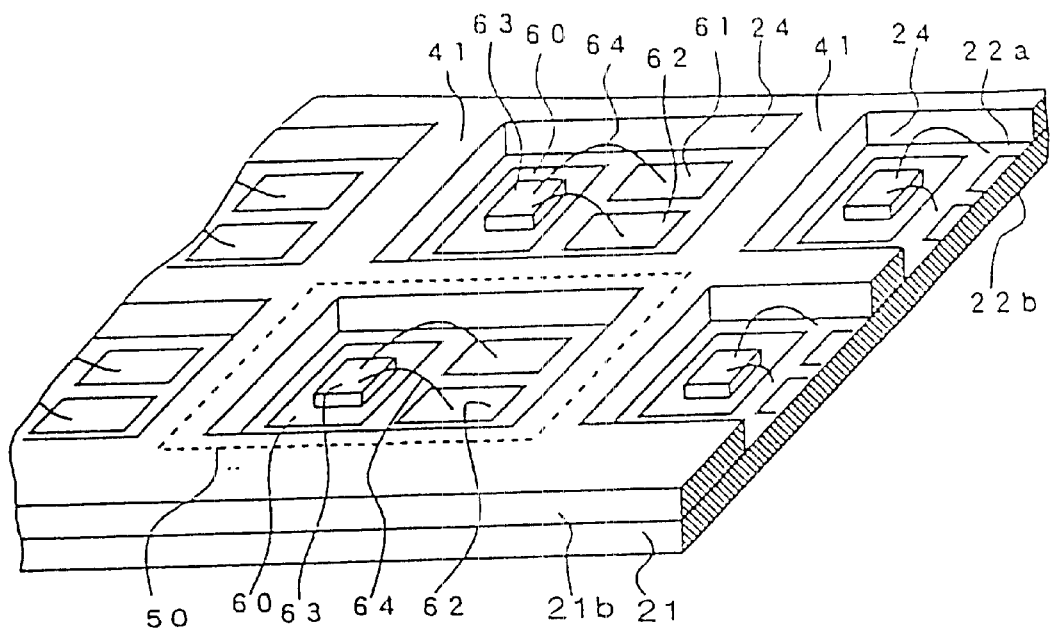
FIGS. 6A and 6B are perspective views showing steps of manufacturing an electronic device respectively according to a third embodiment of the present invention.

Step 1: see FIG. 6A

First, a large substrate 21 is prepared. The large substrate 21 is formed of an insulating material such as ceramic or glass epoxy and has a thickness of 100–500 μm. The substrate 21 has a first main surface 22a forming the top surface and a second main surface 22b forming the bottom surface. A mesh shaped second substrate 21b having a plurality of through-holes is fixed to the substrate 21 to form a plurality of depressions 24 in the surface of the substrate. The framework portion 41 that forms the mesh (depression) of the substrate 21b has a height of 0.1–0.5 mm and a uniform width of 0.25–0.5 mm. The assembly of the substrate 21 and substrate 21b can be integrally formed as one unit.

Each of the depressions 24 has dimensions of approximately 0.8 ×0.6 mm. The depressions 24 are arranged on the substrate 21 at regular intervals both longitudinally and laterally. A plurality of groups each including an island 60 and electrodes 61 and 62 are formed of conductive patterns on the first main surface 22a using such material as gold plating, wherein one group is disposed in each depression 24. The element mounting section 50 comprises each depression 24 and a portion of the framework 41 surrounding the depression 24.

After manufacturing a substrate 21 as described above, a semiconductor chip 63 is die-bonded on the island 60. Bonding wires 64 are formed by wire-bonding connecting between the semiconductor chip 63 and each of the electrodes 61 and 62. The height of the loops formed by the bonding wires 64 should be less than the height of the framework portion 41.

Figure 6B:
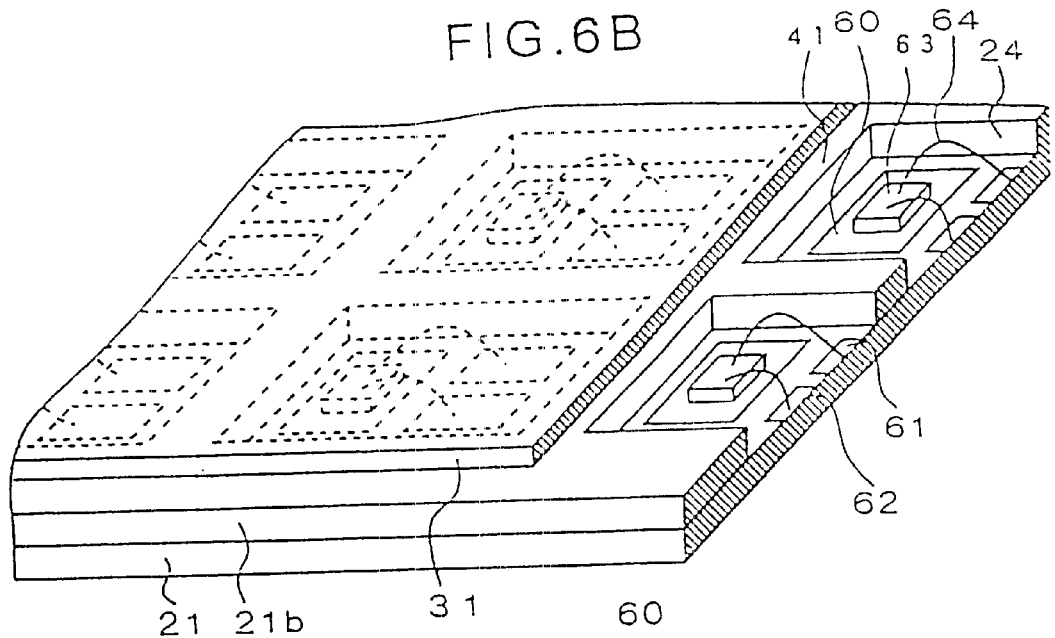

Step 2: see FIG. 6B

One plate-shaped cover member 31 is prepared. The cover member 31 has a thickness of approximately 0.1 mm–0.3 mm and is formed of a ceramic or an organic insulating material. The cover member 31 is bonded to the top of the framework portion 41 to cover the entire plurality of element mounting sections 50 and hermetically seal each of the depressions 24. An epoxy adhesive or the like is used to bond the cover member 31 on the framework portion 41. With this construction, the semiconductor chip 63 and bonding wires 64 are enclosed within a completely airtight space.

Figure 7A:
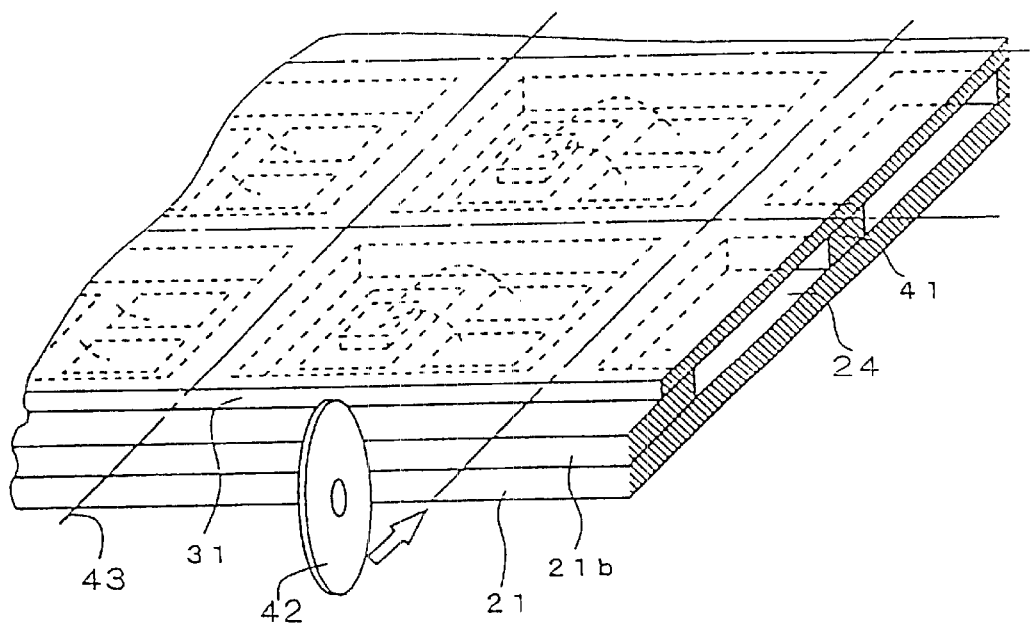
FIGS. 7A and 7B are perspective views showing a step of manufacturing an electronic device according to the third embodiment of the present invention.
Figure 7B:
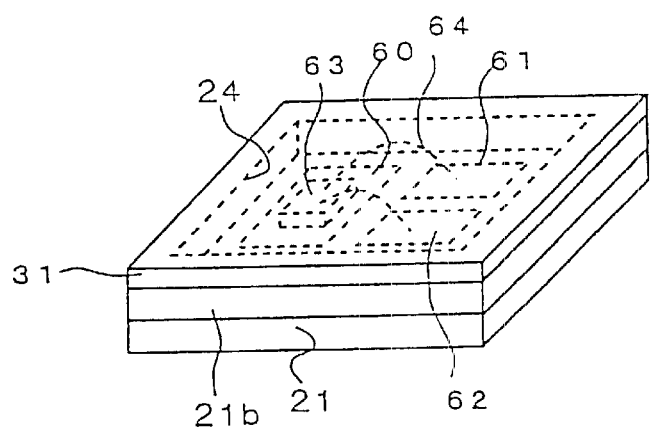

Step 3: see FIGS. 7A and 7B

Each of the element mounting sections 50 is separated by cutting along the guide marks to obtain individual devices, as shown in FIG. 7B. A dicing blade 42 is used to separate the element mounting sections 50. The process is conducted by fixing a dicing sheet to the bottom surface of the substrate 21 (second main surface 22b) and cutting through the substrate 21 and cover member 31 along longitudinal and lateral dicing lines 43 using a dicing blade 42. The dicing lines 43 are positioned along the center of the framework portion 41. It is also possible to attach a bonding sheet to the cover member 31.

Fourth Embodiment

Figure 8A:
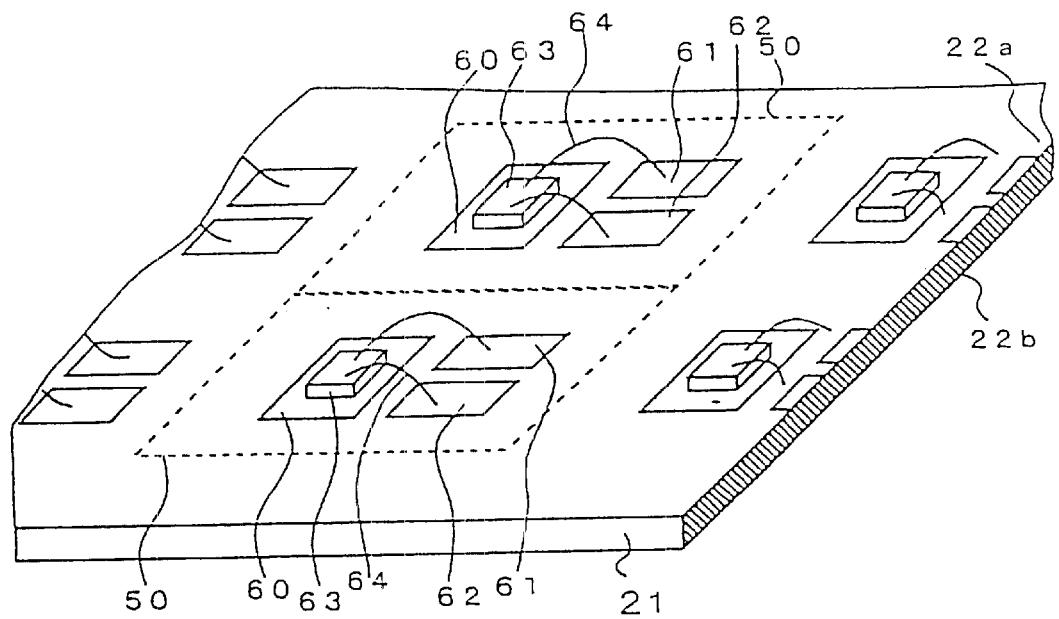
FIGS. 8A and 8B are perspective views respectively showing steps of manufacturing an electronic device according to a fourth embodiment of the present invention.
Figure 8B:
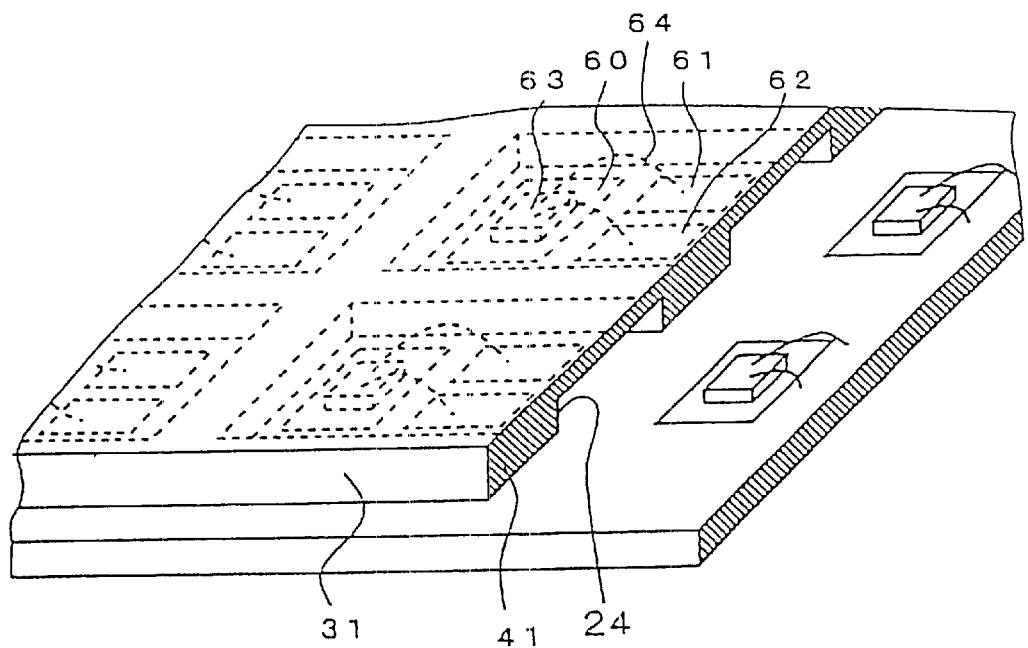

FIGS. 8A and 8B show steps of manufacturing an electronic device according to a fourth embodiment of the present invention, in which a semiconductor chip is used in place of the fuse element.

Step 1: see FIG. 8A

First, a large substrate 21 is prepared. The large substrate 21 is formed of an insulating material such as ceramic or glass epoxy and has a thickness of 0.1–0.5 mm. The substrate 21 has a first main surface 22a at the top surface and a second main surface 22b at the bottom surface. A plurality of groups comprising an island 60 and electrodes 61 and 62 are formed on the first main surface 22a using a conductive pattern formed of such material as gold plating. The element mounting section 50 comprises an area surrounding the island 60 and the electrodes 61 and 62. A plurality of element mounting sections 50 is arranged at equal intervals from each other longitudinally and laterally.

After preparing the substrate 21 with the configuration described above, a semiconductor chip 63 is die-bonded on the island 60 and bonding wires 64 are formed by wire-bonding between the semiconductor chip 63 and each of the electrodes 61 and 62.

Step 2: see FIG. 8B

Next, a cover member 31a is prepared. The cover member 31a has a thickness of approximately of 0.1 mm–0.3 mm and is formed of ceramic or an organic insulating material. The mesh-shaped framework portion 41 having a height of approximately 0.1 mm–0.2 mm and a width of 0.2 mm–0.5 mm is integrally formed with the cover member 31a to form a plurality of depressions 24, such that the depressions 24 face the first main surface 22a and surround each of the element mounting sections 50. The depressions 24 are approximately 0.8 mm ×0.6 mm in size and are arranged at equal intervals from each other longitudinally and laterally.

After completing the die-bonding and wire-bonding processes, the cover member 31 is bonded to the substrate 21 such that each of the element mounting sections 50 is contained within a depression 24. An epoxy adhesive or the like is used to bond the cover member 31 on the substrate 21. As a result of this process, the semiconductor chip 63 and bonding wires 64 are enclosed within a completely airtight space. Since the die-bonding and wire-bonding can be performed on the substrate 21 in the present embodiment, there is not a problem of an adsorption collet or bonding tool contacting the framework portion 41. Accordingly, the depressions 24 can be constructed with smaller dimensions.

Step 3: not shown

As described in the third embodiment, each of the element mounting sections 50 is separated by cutting along the guide marks to obtain individual devices (not shown). The dicing blade 42 is used to separate the element mounting sections 50. The process is conducted by fixing a dicing sheet to the bottom surface of the substrate 21 (second main surface 22b) and cutting through the substrate 21 and cover member 31a along longitudinal and laterally dicing lines 43 using the dicing blade 42. The dicing lines 43 are positioned along the center of the framework portion 41. It is also possible to attach a bonding sheet to the cover member 31a.

Figure 9A:
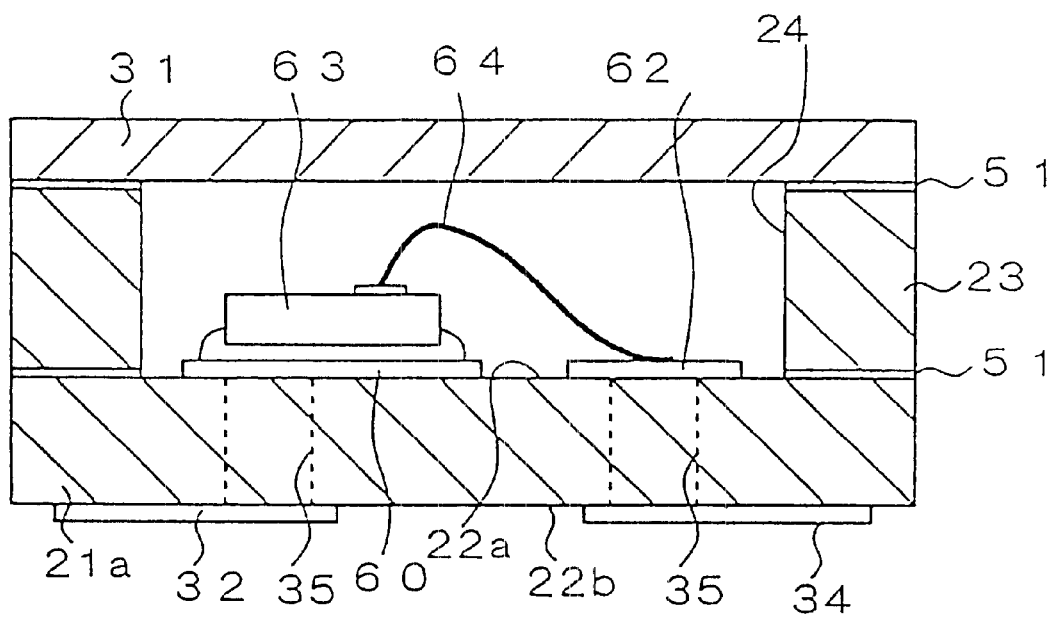
FIGS. 9A and 9B are a detailed cross-sectional view and a plan view showing an electronic device manufactured by the method described in the third embodiment.
Figure 9B:
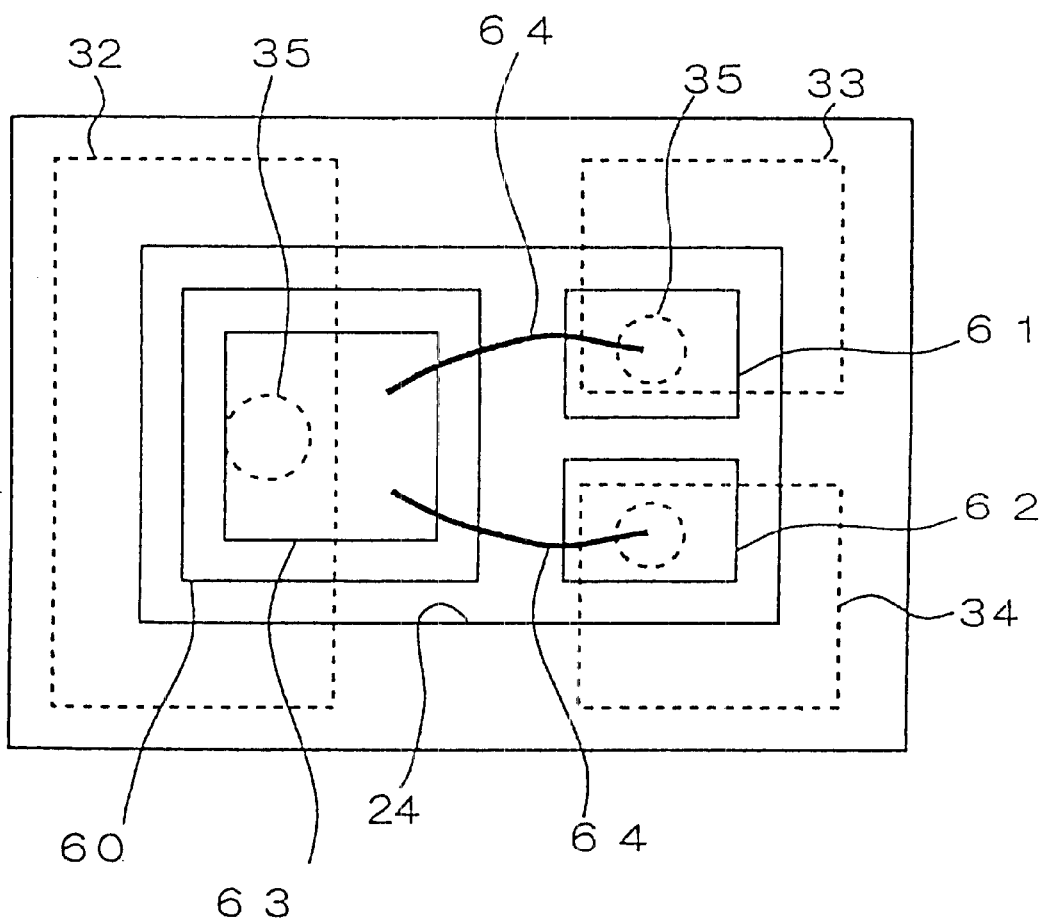

FIGS. 9A and 9B show an electronic device manufactured by the method described in the third embodiment. As shown in the top view shown in FIG. 9B, the substrate 21a separated from the substrate 21 has a rectangular shape with dimensions approximately 1.5 mm ×2.5 mm.

The semiconductor chip 63 die-bonded to the island 60 of the substrate 21a can be formed of a two-terminal element such as a Schottky barrier diode; a three-terminal element such as a MESFET, MOSFET, or the like; or an integrated circuit. The electrode pads formed on the surface of the semiconductor chip 63 are connected to the electrodes 61 and 62 by the bonding wires 64.

External connector terminals 32, 33, and 34 are formed on the second main surface 22b of the substrate 21a by conductive patterns formed of gold plating or the like. Via holes 35 corresponding to each of the external connector terminals 32, 33, and 34 penetrate the substrate 21a from the first main surface 22a to the second main surface 22b. The via holes 35 are filled with a conducting material such as tungsten, silver, copper, or the like, electrically connecting the island 60 to the external connector 32, the electrode 61 to the external connector terminal 33, and the electrode 62 to the external connector terminal 34. The edges of the external connector terminals 32, 33, and 34 are disposed to set back approximately 0.1 mm–0.2 mm from the edges of the substrate 21a. It is desirable for the bonding wires 64 to be connected to positions on the electrodes 61 and 62 directly above the via holes 35. The external connector terminals 32, 33, and 34 are pre-formed on the large substrate 21.

After being cut in the dicing process, the framework portion 41 surrounds the semiconductor chip 63 and a cover member 31 seals the semiconductor chip 63 in an airtight space. The side portions (framework portions) 23 are adhered to the first main surface 22a and the side portions (framework portions) 23 are adhered to the cover member 31 by adhesive 51 respectively. As a result, the semiconductor chip 63 is enclosed in the airtight space formed by the depression 24. Cutting the side portions (framework portions) 23 and 31 in the dicing process forms a flat surface on the outer side faces of the side portions 23 and cover member 31.

The electronic device described above is mounted such that the external connector terminals 32, 33, and 34 are fixed to the opposing electrode patterns respectively on the mounting board.

According to the manufacturing process of the present invention described above, since a lot of electronic devices having hollow packages are manufactured on a large substrate 21, the manufacturing process is simpler than processes in which electronic devices are manufactured individually. Therefore, a production cost per package becomes cheaper. Further, the lead terminals do not protrude externally from the device, allowing its mounting area to be reduced for mounting on a printed circuit board.

The electronic devices described above included examples for a fuse element and a semiconductor chip. However, the device could also contain both a semiconductor chip and a fuse element.

As described above, the manufacturing method of the present invention is that a lot of elements are fabricated on a common substrate and subsequently cutting is conducted for separating into individual electronic devices, and this provides advantages that a lot of electronic devices enclosed in hollow packages are simultaneously produced. This process helps to reduce production costs and produces a cheaper and smaller electronic device having a hollow package.

In the configuration described above, the lead terminals of the element do not protrude externally from the device. Therefore, the mounting area of the electronic device can be reduced.

In the package structure described above, the fuse element is enclosed in the hollow package. Accordingly, it is possible to produce an overcurrent-protection device that does not emit sparks or smoke or cause the device to change color or shape thereof when the fuse element melts.

Although certain preferred embodiments of the present invention have been shown and described in detail, it should be understood that various changes and modifications may be made therein without departing from the scope of the appended claims.

What is claimed is:

1. A method for manufacturing electronic devices, comprising:
    preparing a common substrate having a plurality of element mounting sections, first and second opposite surfaces, a plurality of internal electrodes on said first surface and a plurality of external connector terminals on said second surface;
    fixing an element in each of the element mounting sections;
    sealing the element mounting sections in hollow spaces, respectively, by using a common cover member, such that said external connector terminals remain exposed outside said hollow spaces; and
    separating the plurality of element mounting sections into plural electronic devices, each having at least one of said internal electrodes and at least one of said external connector terminals.

2. A method according to claim 1, wherein the element is a fuse element.

3. A method according to claim 1, wherein the element is a semiconductor chip.

4. A method according to claim 1, wherein the hollow space is provided in the common substrate.

5. A method according to claim 1, wherein the hollow space is provided in the common cover member.

6. A method according to claim 1, wherein said preparing of the common substrate comprises preparing the common substrate to have via holes extending therethrough with conductive material therein connecting between said internal electrodes and said external connector terminals, respectively.

7. A method according to claim 6, wherein said separating of the element mounting sections into the plural electronic devices comprises separating the element mounting sections into the plural electronic devices such that each of the plural electronic devices has at least one of said via holes with conductive material therein.

8. A method according to claim 6, wherein said separating of the element mounting sections into the plural electronic devices comprises separating the element mounting sections into the plural electronic devices such that each of the plural electronic devices has a pair of said external connector terminals, a pair of said internal electrodes and a pair of said via holes with conductive material therein.

9. A method according to claim 1, wherein said fixing of the element in each of the element mounting sections comprises connecting fuse elements between pairs of said internal electrodes such that, upon said separating of the plurality of the element mounting sections into the plural electronic devices, each of said plural electronic devices has one of said fuse elements extending between said pair of internal electrodes.

10. A method according to claim 9, wherein said fuse elements comprise fuse wires, respectively.

11. A method for manufacturing electronic devices, comprising:
    preparing a common substrate having first and second main surfaces;

providing said common substrate with a plurality of pairs of internal electrodes on said first main surface;

providing said common substrate with a plurality of pairs of external connector terminals on said second main surface;

mounting a common cover member on said common substrate to seal said pairs of internal electrodes in separate hollow spaces, respectively, formed between said common substrate and said common cover member, such that said external connector electrodes remain exposed outside said hollow spaces, to thereby form a combined common cover member and substrate; and after said mounting of said common cover member on said common substrate, separating said combined common cover member and substrate into plural electronic devices, each having at least one of said pairs of internal electrodes and at least one of said pairs of external connector terminals.

12. A method according to claim 11, wherein said preparing of the common substrate comprises preparing the common substrate to have via holes extending therethrough with conductive material therein connecting between said internal electrodes and said external connector terminals, respectively.

13. A method according to claim 12, further comprising connecting a fuse element between the internal electrodes of each of said pairs of said internal electrodes such that, upon said separating of said combined common cover member and substrate into the plural electronic devices, each of said plural electronic devices has one of said fuse elements extending between said pair of internal electrodes.

14. A method according to claim 13, wherein said fuse elements comprise fuse wires, respectively.

15. A method according to claim 11, further comprising connecting a fuse element between the internal electrodes of each of said pairs of said internal electrodes such that, upon said separating of said combined common cover member and substrate into the plural electronic devices, each of said plural electronic devices has one of said fuse elements extending between said pair of internal electrodes.

16. A method according to claim 15, wherein said fuse elements comprise fuse wires, respectively.

\* \* \* \* \*